United States Patent

[11] 3,615,855

[72] Inventor Allen H. Smith
Danville, Ind.

[21] Appl. No. 812,976
[22] Filed Apr. 3, 1969
[45] Patented Oct. 26, 1971
[73] Assignee General Motors Corporation
Detroit, Mich.

[54] RADIANT ENERGY PHOTOVOLTALIC DEVICE
9 Claims, 2 Drawing Figs.

[52] U.S. Cl. 136/89, 29/572, 148/175
[51] Int. Cl. H01l 7/44, H01l 15/02
[50] Field of Search 136/89; 148/33.4, 175, 171; 29/572

[56] References Cited

UNITED STATES PATENTS

| | | | |
|---|---|---|---|
| 2,537,257 | 1/1951 | Brattain | 136/89 |
| 2,861,909 | 11/1958 | Ellis | 136/89 X |
| 3,132,057 | 5/1964 | Greenberg | 148/175 UX |
| 3,242,018 | 3/1966 | Grabmaier et al. | 148/33.4 X |
| 3,322,575 | 5/1967 | Ruehrwein | 136/89 |
| 3,488,235 | 1/1970 | Walczak et al. | 148/175 X |

*Primary Examiner*—Allen B. Curtis
*Attorneys*—William S. Pettigrew and Robert J. Wallace

ABSTRACT: A radiant energy conversion device which comprises a silicon slice, a silicon-to-germanium transitional region of a first conductivity type, a germanium layer of a second conductivity type and a pair of ohmic contacts. One form of the device includes an epitaxial deposition of a P-type transitional region onto a low resistivity P-type silicon slice. An N-type germanium layer is then epitaxially deposited on the transitional region. The transitional region contains an electrostatic drift field which improves the collection of charged particles. A current collecting grid is bonded to the silicon slice and a conductive support is bonded to the germanium layer.

INVENTOR.
Allen H. Smith
BY
Robert J. Wallace
ATTORNEY

RADIANT ENERGY PHOTOVOLTALIC DEVICE

BACKGROUND OF THE INVENTION

The photovoltaic conversion of electromagnetic energy to electrical energy is well known. Germanium photovoltaic devices are generally used to convert the electromagnetic radiation of a warm body, referred to as radiant energy, into electrical energy. This is because the maximum amount of energy from a moderately high temperature source, such as 2,000° K., is radiated in a spectral range where the germanium photovoltaic cell has its greatest sensitivity.

Germanium has a band gap of approximately 0.7 electron volts. This corresponds to photons of electromagnetic energy having a wavelength of approximately 1.8 microns. This is well into the infrared range. A germanium photovoltaic cell has a relatively poor sensitivity to electromagnetic energy having a shorter wavelength. Silicon by comparison has a band gap of approximately 1.1 electron volts and responds more favorably to electromagnetic energy having a shorter wavelength such as in the visible and ultraviolet regions of the spectrum.

In order to reduce the recombination rate of excited carriers, photovoltaic devices are generally fabricated to contain an electrostatic drift field. This field tends to accelerate the excited minority carriers toward the PN junction where they can be separated. It is traditionally obtained by a concentration gradient of majority carriers in the semiconductive material. However, as majority carrier concentration increases minority carrier life times and mobilities decrease. Consequently, use of a concentration gradient to obtain better acceleration inherently decreases minority carrier life times and mobilities. Thus, one must appropriately balance these factors to obtain optimum efficiency for any particular photovoltaic cell.

The collection rate of charged particles is further materially reduced by surface recombination in the usual photovoltaic cell. At the surface of a crystal the periodicity of the lattice ceases and various foreign materials attach thereto. When the semiconductive material is quite thin the effect of surface recombination is greater than the effect of bulk recombination. The radiation incident surface of the photovoltaic cell must be polished to be as smooth as possible. The mechanical working necessary to obtain a smooth surface further increases the surface recombination rate of the typical photovoltaic cell.

The majority of photons from a radiant energy source are absorbed in the first five microns of the germanium photovoltaic cell. Accordingly, these devices are made to have their PN junction generally within 5 microns of the radiation incident surface. Consequently, only a small cross-sectional area is available to collect current between the radiation incident surface and the PN junction. This results in a high resistance path parallel to the radiation incident surface. This type of resistance is commonly referred to as spreading resistance and it can materially reduce output energy.

Radiant energy conversion devices customarily are subjected to much higher radiation levels than solar radiation sensitive devices. At the earth's surface the intensity of bright sunlight is approximately 0.10 watt/cm². Radiant energy conversion devices are normally subjected to a radiation energy flux of about 1 to 10 watt/cm². Surface damage to germanium photovoltaic cells due to such a high radianl flux may result.

SUMMARY OF THE INVENTION

Accordingly, it is an object of this invention to provide a radiant energy conversion device which increases the collection of charged particles by utilizing an electrostatic drift field without reducing carrier life times and mobilities.

It is another object of this invention to provide a radiant energy conversion device which provides an optically smooth surface to the incident radiation without materially increasing the recombination rate of the charged particles.

It is a further object of this invention to provide a radiant energy conversion device wherein photons are absorbed near the PN junction, yet are collected with minimal internal losses due to spreading resistance.

It is yet a further object of this invention to provide a radiant energy conversion device wherein the radiant incident surface of the germanium photovoltaic cell is protected from the degrading effects of high radiant flux.

These and other objects of the invention are accomplished by epitaxially depositing on one surface of a monocrystalline slice of P-type silicon a P-type silicon-to-germanium transitional region; epitaxially depositing an N-type germanium layer on the transitional region to form a PN junction; lapping and polishing to an optically smooth finish the opposite surface of the silicon slice and bonding a light permeable current collecting grid to the optically polished surface of the silicon slice. Also, an ohmic contact is bonded to the epitaxial layer of N-type germanium to complete the device.

BRIEF DESCRIPTION OF THE DRAWINGS

Other objects, features and advantages of this invention will become more apparent from the following description of the preferred examples, and from the drawings in which.

DETAILED DESCRIPTION OF PREFERRED EMBODIMENT

Figure 1:
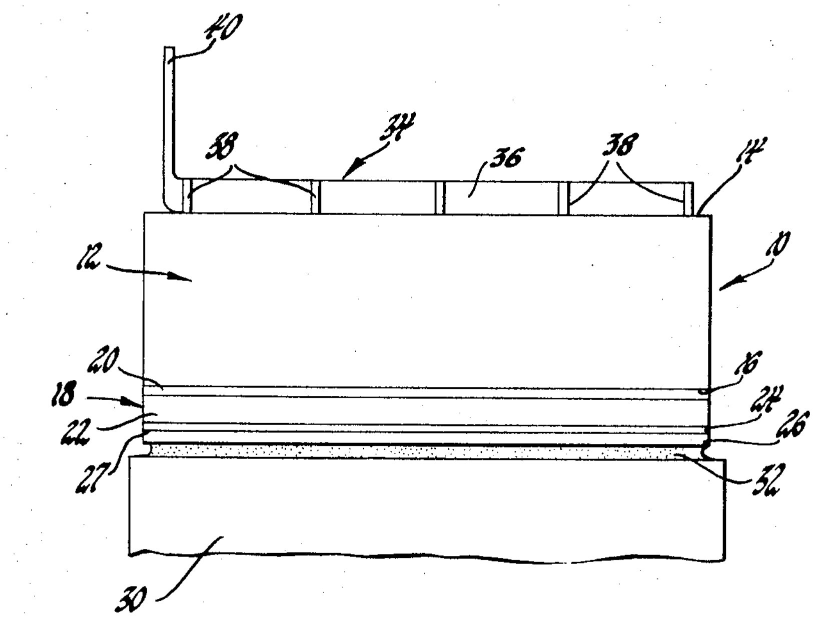
FIG. 1 is a side elevational view of a radiant energy conversion device made in accordance with this invention.

Reference is now made to the FIGURES and more particularly to FIG. 1 wherein is shown a radiant energy conversion device 10. Device 10 contains a monocrystalline P-type silicon slice 12 which has a relatively low resistivity of approximately 0.01 ohm-cm. Slice 12 which has major surfaces 14 and 16 substantially parallel to one another is approximately 10 microns thick. Major surface 14 is an optically polished radiation incident surface. An epitaxial silicon-to-germanium transitional region 18 is contiguous surface 16. It is also coextensive with surface 16, of P-type conductivity and has a moderate resistivity of approximately 0.1 ohm-cm.

Region 18 comprises a substantially pure silicon layer 20 contiguous surface 16, an intermediate layer of silicon and germanium 22, and a substantially pure germanium layer 24. The silicon-germanium ratio within layer 22 changes progressively from substantially all silicon at silicon layer 20 to substantially all germanium at germanium layer 24. This change takes place in a linear manner. Intermediate layer 22, however, has a substantially uniform composition in a plane parallel to the major surfaces of slice 12. The thickness of layer 22 is approximately 10 microns and the thickness of region 18 is approximately 20 microns.

An N-type germanium epitaxial layer 26 is contiguous layer 24 and has a moderate resistivity of approximately 0.1 ohm-cm. Layer 26 is also coextensive with layer 24 and has a thickness of approximately 5 microns. A PN junction 27 is formed between N-type germanium layer 26 and P-type germanium layer 24. The layers of device 10 are all of uniform thickness so that PN junction 27 is substantially parallel to radiation incident surface 14 on silicon slice 12.

Figure 2:
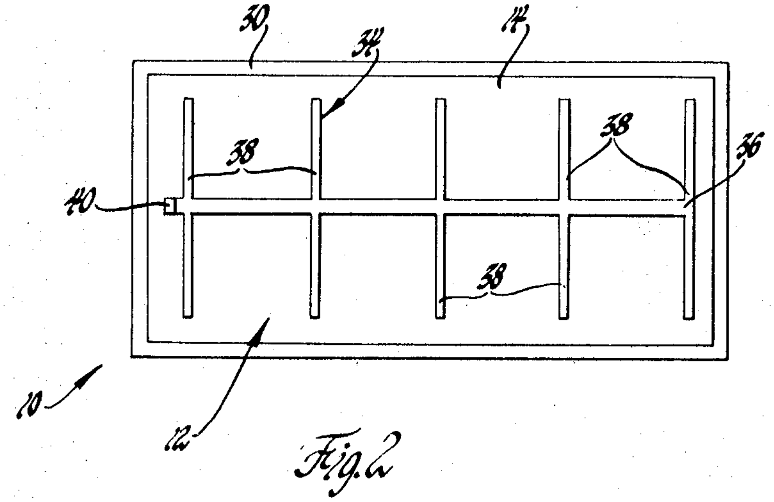
FIG. 2 is a plan view of the top surface of the device shown in FIG. 1.

A conductive support 30 is bonded to germanium layer 26 by a thin layer of solder 32 forming an ohmic contact thereto. A portion of support 30 is coextensive with germanium layer 26 on a surface opposite to PN junction 27. As best seen by FIG. 2, a current collecting grid 34 having a longitudinal member 36 and a plurality of parallel transverse members 38 is bonded to surface 14. Grid 34 forms an ohmic contact with surface 14. An upstanding tab 40 is secured to grid 34 to facilitate external lead connections.

In order to make this device, a thick monocrystalline slice of P-type conductivity, having a low resistivity of 0.01 ohm-cm. or less, can be etched, lapped and polished to a final thickness of about 8 to 10 mils. This slice is designated slice 12. In the above process, the surface designated as radiation incident surface 14 is polished to an optical finish in the known and accepted manner.

P-type silicon-to-germanium transitional region 18 should have a moderate resistivity of approximately 0.05 to 0.5 ohm-cm. Layer 26 should also have a moderate resistivity of 0.05 to 0.5 ohm-cm. The epitaxial depositions of region 18 and layer 26 can be made with conventional techniques using conventional epitaxial deposition apparatus. Under low pressure, 100 mm. mercury, silicon slice 12 is heated to a temperature of approximately 700 °C.

Silicon and germanium depositions can be made by hydrogen reduction of $SiI_4$ and $GeI_4$ vapors transported by argon gas. For example, $SiI_4$ is rapidly heated to a temperature of 500° C. and gradually decreased to 200° C. during about a 20 minute interval. Diborane is introduced in the ratio of approximately 150 parts per million to the $SiI_4$ vapor during this time. This is sufficient to give a P-type resistivity of approximately 0.1 ohm-cm. to the epitaxial deposition. After about the first 5 minutes of this deposition, which produces layer 20, germanium deposition is commenced.

$GeI_4$ is gradually heated from a temperature of about 100° C. to 350° C. for approximately 25 minutes. Accordingly, for approximately 15 minutes both silicon and germanium are deposited forming a layer designated as layer 22. However, during this time the silicon deposition rate is decreasing and the germanium deposition rate is increasing at approximately the same rate. P-type doping with diborane continues in the aforementioned ratio of approximately 150 parts per million to the composite vapor. This is sufficient to give a P-type resistivity of approximately 0.1 ohm-cm. to the combined depositions too.

After about 20 minutes, silicon deposition is terminated. Germanium deposition however, continues for about 10 more minutes first forming a substantially pure germanium layer which is designated layer 24. After the formation of this layer which requires about 5 minutes, P-type of doping with diborane is then terminated and N-type doping is commenced. Phosphine is introduced in an approximate ratio of 150 parts per million to the $GeI_4$ vapor. A PN junction is thus formed which is designated PN junction 27. Germanium deposition continues for about 5 minutes forming a layer 26. The entire epitaxial deposition process consumes approximately ½ hour.

Current collecting grid 34 which is a metallic nickel occupies less than 10 percent of the surface area 14. As a consequence thereof, a high percentage of the incident radiant energy falls directly upon surface 14. Consequently, grid 34 is essentially light permeable. The grid formed by member 34 and members 36 improves collection of charged particles over the surface area 14. This minimizes the distance that a particle must travel to be collected. Grid 34 is fabricated by conventional and well-known evaporation techniques. The nickel is evaporated on surface 14 using an appropriate configured metal mask.

As should be appreciated, radiation from a suitable radiant energy source striking surface 14 will create electron-hole pairs. The electron-hole pairs will be created predominantly in region 18 and layer 26. An electrostatic drift field exists in region 18 because of the varying silicon-germanium proportion contained there. This field will accelerate minority particles toward PN junction 27. The space charged depletion region existing at junction 27 will separate the minority carriers. It should be noted that minority carrier life times and mobilities have not been decreased.

It should be further appreciated that silicon slice 12 is substantially transparent to most of the radiation form a radiant source. However, it does provide a thick low resistivity conducting layer for collecting charged particles. The relatively large cross-sectional area of slice 12 also minimizes spreading resistance.

It should also be appreciated that an additional benefit of transitional region 18 is that the high energy spectral response of device 10 will be shifted toward the silicon response region thereby increasing the total energy output. Layer 22 by virtue of the linearly varying percentages of silicon and germanium will be more sensitive to electromagnetic energy having a shorter wavelength than a pure germanium layer. Consequently, more charged particles will be available for collection.

Furthermore, it should be appreciated that there are other ways of obtaining an electrostatic drift field in conjunction with a PN junction using the inventive concepts disclosed herein. For example, the entirety of region 18 could comprise a mixture of silicon and germanium that changes progressively from substantially all silicon to substantially all germanium. Analogously layer 26 could include a small proportion of silicon.

It should also be appreciated that since surface 14 is substantially pure silicon other benefits are realized. Silicon inherently offers a more stable surface to incident radiation than does germanium. Hence, the degrading surface effects observed in certain types of germanium photovoltaic cells will not be present in this device.

While the invention has been particularly shown and described with reference to a preferred embodiment, it will be understood by those skilled in the art that various changes in form and detail may be made therein without departing from the spirit and scope of this invention.

I claim:

1. A photovoltaic radiant energy conversion device comprising:

a low resistivity silicon slice of one conductivity type having first and second major surfaces, said first surface being substantially smooth for optimum optical properties;

a germanium layer of opposite conductivity type substantially coterminous to said silicon slice;

a silicon-to-germanium transitional region spacing said second silicon surface and said germanium layer apart for producing an electrostatic drift field, said transitional region being of said one conductivity type and substantially coterminous to said silicon slice;

a PN junction between said germanium layer and said transitional region for separating electron-hole pairs created by the absorption of photons of radiant energy adjacent the interface of said transitional region and said germanium layer, said PN junction being substantially parallel said optically smooth first silicon surface; and ohmic contacts on said germanium layer and said first silicon surface respectively for collecting charged carriers of electric current, with the ohmic contact on said first silicon surface being light permeable.

2. The photovoltaic radiant energy conversion device as defined in claim 1 wherein;

said silicon-to-germanium transitional region includes a silicon layer contiguous to said silicon slice, a germanium layer, and an intermediate layer of silicon and germanium.

3. The photovoltaic radiant energy conversion device as defined in claim 2 wherein:

the composition of said intermediate layer changes generally linearly from substantially all silicon adjacent the silicon layer to substantially all germanium adjacent the germanium layer.

4. The photovoltaic radiant energy conversion device as defined in claim 3 wherein:

said silicon slice has a resistivity of 0.01 ohm-cm. or less and substantially parallel major surfaces;

said silicon-to-germanium transitional region has a resistivity of 0.05 to 0.6 ohm-cm.; and said germanium layer contiguous the transitional region has a resistivity of 0.05 to 0.5 ohm-cm.

5. A photovoltaic radiant energy conversion device comprising:

a silicon slice P-type conductivity having first and second major surfaces, said first surface being substantially smooth for optimum optical properties;

a light permeable current collector grid bonded on said first surface to form a first ohmic contact;

a germanium layer of N-type conductivity substantially coterminous to said silicon slice;

a P-type conductivity silicon-to-germanium transitional region spacing said second silicon surface and said germanium layer apart for producing an electrostatic drift field, said transitional region being substantially coterminous to said silicon slice;

A PN junction between said transitional region and said germanium layer for separating electron-hole pairs created by the absorption of photons of radiant energy adjacent the interface of said region and said germanium layer, said PN junction being substantially parallel said optically smooth first silicon surface; and a conductive support bonded to said N-type germanium layer forming a second ohmic contact.

6. A photovoltaic radiant energy conversion device comprising:

a 0.01 ohm-cm. or less silicon slice of P-type conductivity having substantially parallel first and second major surfaces, said first surface being substantially smooth for optimum optical properties;

a light permeable current collector grid bonded on said first surface to form a first ohmic contact;

a 0.05 to 0.5 ohm-cm. silicon-to-germanium transitional region of P-type conductivity having spaced-apart silicon and germanium layers and an intermediate layer containing a mixture of silicon and germanium which varies linearly in silicon to germanium ratio perpendicular to the thickness of the layer for producing an electrostatic drift field, said transitional region being epitaxially deposited on said second major surface of said silicon slice, said transitional region being contiguous and substantially coterminous with said second major surface of said silicon slice;

a 0.05 to 0.5 ohm-cm. epitaxial germanium layer of N-type conductivity on said germanium layer of said transitional region, said germanium layer of N-type conductivity being contiguous and substantially coterminous to said germanium layer of said transitional region forming a PN junction substantially parallel to said first surface of said silicon slice for separating electron-hole pairs created by the absorption of photons of radiant energy; and a conductive support bonded to said germanium layer of N-type conductivity forming a second ohmic contact.

7. A method for making a photovoltaic radiant energy conversion device which comprises:

preparing a low resistivity silicon slice of a first conductivity type to receive an epitaxial coating;

epitaxially depositing a silicon-to-germanium transitional region of said first conductivity type on said silicon slice;

epitaxially depositing a germanium layer of a second conductivity type on said transitional region forming PN junction therewith;

bonding a light permeable ohmic contact on said silicon slice; and bonding an opaque ohmic contact to said germanium layer.

8. The method of making a photovoltaic radiant energy conversion device as defined in claim 7 wherein;

said silicon slice has a resistivity of 0.01 ohm-cm. or less;

said silicon-to-germanium transitional region has a resistivity of 0.05 to 0.1 ohm-cm.; and said germanium layer of a second conductivity type has a resistivity of 0.05 to 0.1 ohm-cm.

9. A method for making a photovoltaic radiant energy conversion assembly which comprises:

preparing a first surface of a low resistivity silicon slice of P-type conductivity to receive an epitaxial coating;

lapping and polishing a second surface of said silicon slice to an optical finish;

epitaxially depositing a silicon-to-germanium transitional region of moderate resistivity of P-type conductivity on said first surface of said silicon slice commencing with a substantially silicon deposition and terminating with a substantially germanium deposition;

epitaxially depositing a germanium layer of N-type conductivity of moderate resistivity on said transitional region;

evaporating a current collector grid on said second surface of said silicon slice; and bonding a conductive support to said germanium layer of N-type conductivity.

* * * * *